(12) United States Patent
Imhof et al.

(10) Patent No.: US 10,838,108 B2
(45) Date of Patent: Nov. 17, 2020

(54) METHOD AND SYSTEM FOR INTERPOLATING DISCONTINUOUS FUNCTIONS IN A SUBSURFACE MODEL

(71) Applicants: Matthias Imhof, Katy, TX (US); Matthew S. Casey, Houston, TX (US)

(72) Inventors: Matthias Imhof, Katy, TX (US); Matthew S. Casey, Houston, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 426 days.

(21) Appl. No.: 15/844,173

(22) Filed: Dec. 15, 2017

(65) Prior Publication Data

US 2018/0188415 A1    Jul. 5, 2018

Related U.S. Application Data

(60) Provisional application No. 62/440,153, filed on Dec. 29, 2016.

(51) Int. Cl.
*G01V 99/00* (2009.01)
*G06F 30/20* (2020.01)

(52) U.S. Cl.
CPC .......... *G01V 99/005* (2013.01); *G06F 30/20* (2020.01)

(58) Field of Classification Search
None
See application file for complete search history.

(56) References Cited

U.S. PATENT DOCUMENTS

| | | |
|---|---|---|
| 8,965,745 B2 | 2/2015 | Lepage |
| 9,378,312 B2 | 6/2016 | Lepage et al. |
| 2011/0002194 A1* | 1/2011 | Imhof ............. G01V 1/32 367/53 |
| 2012/0010865 A1 | 1/2012 | Benson |
| 2014/0136171 A1 | 5/2014 | Sword, Jr. et al. |
| 2015/0066460 A1 | 3/2015 | Klinger et al. |
| 2016/0124113 A1 | 5/2016 | Bi et al. |
| 2016/0124116 A1 | 5/2016 | Souche et al. |
| 2016/0124117 A1 | 5/2016 | Huang et al. |

FOREIGN PATENT DOCUMENTS

EP    2 447 916 A1    5/2012

OTHER PUBLICATIONS

Besenghi et al. (1999) "Scattered Data Near-Interpolation with Application to Discontinuous Surfaces" in the proceedings of the "*International Conference on Curves and Surfaces* [4th]", Saint-Malo France, Jul. 1-7 pp. 75 to 84.
Franke et al. (1983) "Surface Approximation with Imposed Conditions", *SURFACES IN CAGD*, , North-Holland Publishing Company, pp. 135-146.

* cited by examiner

*Primary Examiner* — Bijan Mapar
(74) *Attorney, Agent, or Firm* — ExxonMobil Upstream Research Company—Law Department

(57) ABSTRACT

A method and system are described for creating a subsurface model. In this method, discontinuous functions are interpolated in a subsurface model. The method extrapolates specified values over discontinuous manifolds by embedding the manifold in a higher-dimensional space that amplifies distances across discontinuities and thus eliminates special consideration to prevent extrapolation across discontinuities. The resulting subsurface model may be used in reservoir simulations and hydrocarbon operations.

17 Claims, 6 Drawing Sheets

METHOD AND SYSTEM FOR INTERPOLATING DISCONTINUOUS FUNCTIONS IN A SUBSURFACE MODEL

CROSS-REFERENCE TO RELATED APPLICATION

This application claims the benefit of U.S. Provisional Patent Application 62/440,153, filed Dec. 29, 2016, entitled METHOD AND SYSTEM FOR INTERPOLATING DISCONTINUOUS FUNCTIONS IN A SUBSURFACE MODEL, the entirety of which is incorporated by reference herein.

FIELD OF THE INVENTION

This disclosure relates generally to the field of hydrocarbon exploration, development and production and, more particularly, to subsurface modeling. Specifically, the disclosure relates to a method for interpolating discontinuous functions in a subsurface model. The method extrapolates specified values over discontinuous manifolds by embedding the manifold in a higher-dimensional space that amplifies distances across discontinuities and thus eliminates special consideration to prevent extrapolation across discontinuities. The resulting interpolation may enhance a subsurface model for a subsurface region, which may then be used for reservoir simulations and hydrocarbon operations, such as hydrocarbon exploration, hydrocarbon development and/or hydrocarbon production.

BACKGROUND

This section is intended to introduce various aspects of the art, which may be associated with exemplary embodiments of the present disclosure. This discussion is believed to assist in providing a framework to facilitate a better understanding of particular aspects of the present invention. Accordingly, it should be understood that this section should be read in this light, and not necessarily as admissions of prior art.

In exploration, development and/or production stages for resources, such as hydrocarbons, different types of subsurface models may be used to represent the subsurface structure, which may include a description of a subsurface structure and material properties for a subsurface region. For example, the subsurface model may be a watertight model, a geologic model or a reservoir model. The subsurface model may represent measured or interpreted data for the subsurface region, may be within a physical space or domain, and may include objects (e.g., horizons, faults, surfaces, volumes, and the like). The subsurface model may also be discretized with a mesh or a grid that includes nodes and forms blocks (e.g., cells, voxels or elements) within the model. By way of example, the watertight model may be created from a structural framework (e.g., organization of objects) and provide defined compartments or subvolumes. The geologic model may represent measured or interpreted data for the subsurface region, such as seismic data and/or well log data. The geologic model may be within a physical space or domain and may have material properties, such as rock properties. The reservoir model may be used to simulate flow of fluids within the subsurface region. Accordingly, the reservoir model may use the same grid and/or blocks as other models, or may resample or upscale the grid and/or blocks to lessen the computations for simulating the fluid flow.

The development of the reservoir model or geologic model may be problematic. For example, faults are discontinuities in the subsurface regions, which are difficult to handle in subsurface modeling. At faults, layers and/or surfaces in the subsurface region are bisected and often displaced. Some of the properties, such as depth, elevation, fluid pressure, and/or pore-fluid type, may differ across the fault. The problems with faults is further compounded by sparse measurements being relied upon from wells or seismic data and having to extrapolate over large distances to build maps or digital models of a specified subsurface region. Preferably, some properties are not interpolated across faults, but rather extrapolated to each specified fault from either side. For example, the conventional method may utilize a line of sight criterion to determine which observations should contribute to the extrapolation at a specified point, which is computationally costly. Other methods are based on solving a differential equation that may require specification of boundary conditions on the fault discontinuities and model boundaries which limits flexibility.

Many measurements or subsurface properties are discontinuous across faults. Depth or elevation of a specified surface, for example, is discontinuous because the fault displaces the surface vertically and laterally. Fluid pressure often correlates with depth, and thus may be discontinuous across a fault. Pressure or gravity induced buoyancy may create a fluid stratification that differs on the two sides of a fault. Preferably, interpolation accounts for these discontinuities by limiting interpolation to either side without mixing observations across a fault.

Various approaches have been developed to create subsurface models. For example, U.S. patent application 20120010865 describes a method where an expression is selected to approximate measurement-based values of a geologic attribute along a dimension of a subsurface formation as a function of position along the dimension. Values for terms of the expression are determined such that the expression satisfies an objective function to within a predetermined amount. The objective function indicates a difference between outputs of the expression and the measurement-based values at similar points along the dimension. The expression and the values of the terms of the expression are outputted which includes mapping the terms of the expression to represent the geologic attribute in the subsurface formation such that the geologic attribute is described at all locations in the subsurface formation using the expression and the values of the terms of the expression. However, the method is inflexible because the expression needs to allow for the discontinuities. Another disadvantage is that the expression varies along a single direction only, which further reduces flexibility.

As another example, U.S. Patent Application Publication No. 20140136171 describes an earth model of a subsurface reservoir having an unstructured tetrahedral grid defining a plurality of tetrahedral cells that conform to geological discontinuities. The tetrahedral cells define vertices in a physical space that store information associated with a depositional space of the subsurface reservoir. A polyhedral grid is generated in the physical space from the unstructured tetrahedral grid. The polyhedral grid defines a plurality of polyhedral cells that are split based on the information associated with the depositional space. One or more of the plurality of polyhedral cells can be associated with one or more elements having split-property values that correspond to properties on opposite sides of the one or more geological discontinuities. The polyhedral grid is used to model the behavior of the subsurface reservoir. The disclosure describes a method that performs continuous interpolation in a discontinuous domain and does not address discontinuous interpolation.

As another example, U.S. Patent Application Publication No. 20150066460 describes a method that involves receiving implicit function values at nodes of a coarse mesh of a region of interest in a geologic environment; formulating constraints based at least in part on the data; solving a system of equations for a finer mesh subject to the constraints; and outputting implicit function values at nodes of the finer mesh based at least in part on solving the system of equations.

Further, U.S. Patent Application Publication No. 20160124116 describes a method apparatus and program product may utilize a stratigraphic implicit function. In particular, structural information for a subsurface formation may be generated by determining a location in a volume of interest in the subsurface formation from subsurface formation data associated with the subsurface formation accessing a numerical model having a monotonously varying stratigraphic implicit function defined within the volume of interest to determine a value of the stratigraphic implicit function corresponding to the determined location and generating at least one structural element for the subsurface formation from the stratigraphic implicit function of the numerical model based upon a spatial distribution of the determined value within the volume of interest.

In addition, U.S. Pat. No. 8,965,745 describes a method that involves providing in a geological domain a conformal mesh conformal to geological discontinuities of a geological model that includes depositional domain coordinates associated with a depositional domain; providing in the depositional domain an initial at least vertically structured multidimensional grid that includes initial nodes that define grid cells; referencing the conformal mesh to identify a set of grid cells of the initial grid traversed by the geological discontinuities; splitting each of the grid cells in the set to form sub cells each of the sub cells defined at least in part by one or more new nodes; and assigning geological domain coordinates associated with the geological domain to at least the new nodes to generate a final grid that includes the initial nodes the new nodes and geological domain coordinates associated with the geological domain.

Moreover, U.S. Pat. No. 9,378,312 describes a method that involves providing a mesh of a geologic environment that includes conformable sequences and an unconformity; interpolating an implicit function defined with respect to the mesh to provide values for the implicit function; and identifying an iso-surface based on a portion of the values where the iso-surface represents the unconformity as residing between two of the conformable sequences.

Further still, other conventional approaches account for discontinuities by penalizing invisibility. When the line of sight between a new data point and a known data point is disrupted by a discontinuity, then the distance is increased by the necessary detour. Examples of such methods are described in Franke and Nielson, "Surface Approximation with Imposed Conditions", in "SURFACES IN CAGD", p. 135 to 146, North-Holland Publishing Company, 1983; and Besenghi and Allasia, "Scattered Data Near-Interpolation with Application to Discontinuous Surfaces" in the proceedings of the "International Conference on Curves and Surfaces [4th]", Saint-Malo France, 1-7 Jul. 1999, p. 75 to 84. Repeated evaluation of visibility for known data points and the resulting penalties can be very time consuming because the evaluation needs to be repeated for each new data point.

Accordingly, there remains a need in the industry for methods and systems that are more efficient and may lessen problems associated with forming a subsurface model for use in hydrocarbon operations. Further, a need remains for an enhanced method to interpolate over discontinuous objects, while preserving flexibility of the interpolation method used. In addition, a need remains for an enhanced method for transforming a discontinuous object into a metric space. The present techniques provide a method and apparatus that overcome one or more of the deficiencies discussed above.

SUMMARY

In one embodiment, a method for generating a subsurface model for a subsurface region is described. The method may comprise: creating a mesh for a subsurface region in an original domain; computing connectivity and compartmentalization of the mesh; transforming the mesh into a transform domain wherein the transform domain is configured to exaggerate distance across discontinuities; transforming measured data into the transform domain; interpolating the measured data to the mesh in the transform domain; transforming the interpolated measurements to the original domain; and outputting the interpolated mesh and/or measurements in the original domain.

In other embodiments, various enhancements may be described. For example, the method may include wherein dimensionality of the created mesh plus the number of discontinuities may be an upper bound on the dimensionality of the transform domain; wherein the transforming mesh into the transform domain my further comprise preserving local distances between surface nodes in the mesh, but exaggerates distances when nodes are separated by a discontinuity; wherein the distance may be computed based on a Manhattan distance that is computed by propagating the distance from a first surface node to a second surface node; wherein the distance may be computed based on a Euclidian distance that is computed between a first surface node to a second surface node; building a reservoir model from the interpolated mesh and assigning properties to the mesh elements of the interpolated mesh; wherein the properties comprise one or more of porosity, permeability and any combination thereof; simulating fluid flow within the reservoir model to create simulation results; wherein the measured data are either at least one component of the mesh coordinates or a categorical, discrete, or continuous property attributed to mesh nodes; managing hydrocarbon operations based on the simulation results.

In yet another embodiment, a system for generating a subsurface model having one or more objects associated with a subsurface region is described. The system comprises: a processor; an input device in communication with the processor and configured to receive input data associated with a subsurface region; and memory in communication with the processor. The memory having a set of instructions, wherein the set of instructions, when executed by the processor, are configured to: create a mesh for a subsurface region in an original domain; compute connectivity and compartmentalization of the mesh; transform the mesh into a transform domain wherein the transform domain is configured to exaggerate distance across discontinuities; transform measured data into the transform domain; interpolate the measured data to a mesh in the transform domain; transform the interpolated measurements to the original domain; and output the interpolated mesh and/or measurements in the original domain.

In one or more embodiments, the system may include various enhancements. For example, the system may include wherein dimensionality of the created mesh plus the number of discontinuities may be an upper bound on the dimensionality of the transform domain; wherein the set of instructions may be further configured to: preserve local distances between surface nodes in the mesh, but exaggerates distances when nodes are separated by a discontinuity; wherein the set of instructions may be configured to: compute the distance based on a Manhattan distance that is computed by propagating the distance from a first surface node to a second surface node; wherein the set of instructions may be configured to: compute the distance based on a Euclidian distance that is computed between a first surface node to a second surface node; wherein the set of instructions may be configured to: build a reservoir model from the interpolated mesh and assign properties to the mesh elements of the interpolated mesh; wherein the properties comprise one or more of porosity, permeability and any combination thereof; simulating fluid flow within the reservoir model to create simulation results; wherein the set of instructions may be further configured to: manage hydrocarbon operations based on the simulation results.

BRIEF DESCRIPTION OF THE DRAWINGS

The advantages of the present invention are better understood by referring to the following detailed description and the attached drawings.

DETAILED DESCRIPTION

Figure 1:
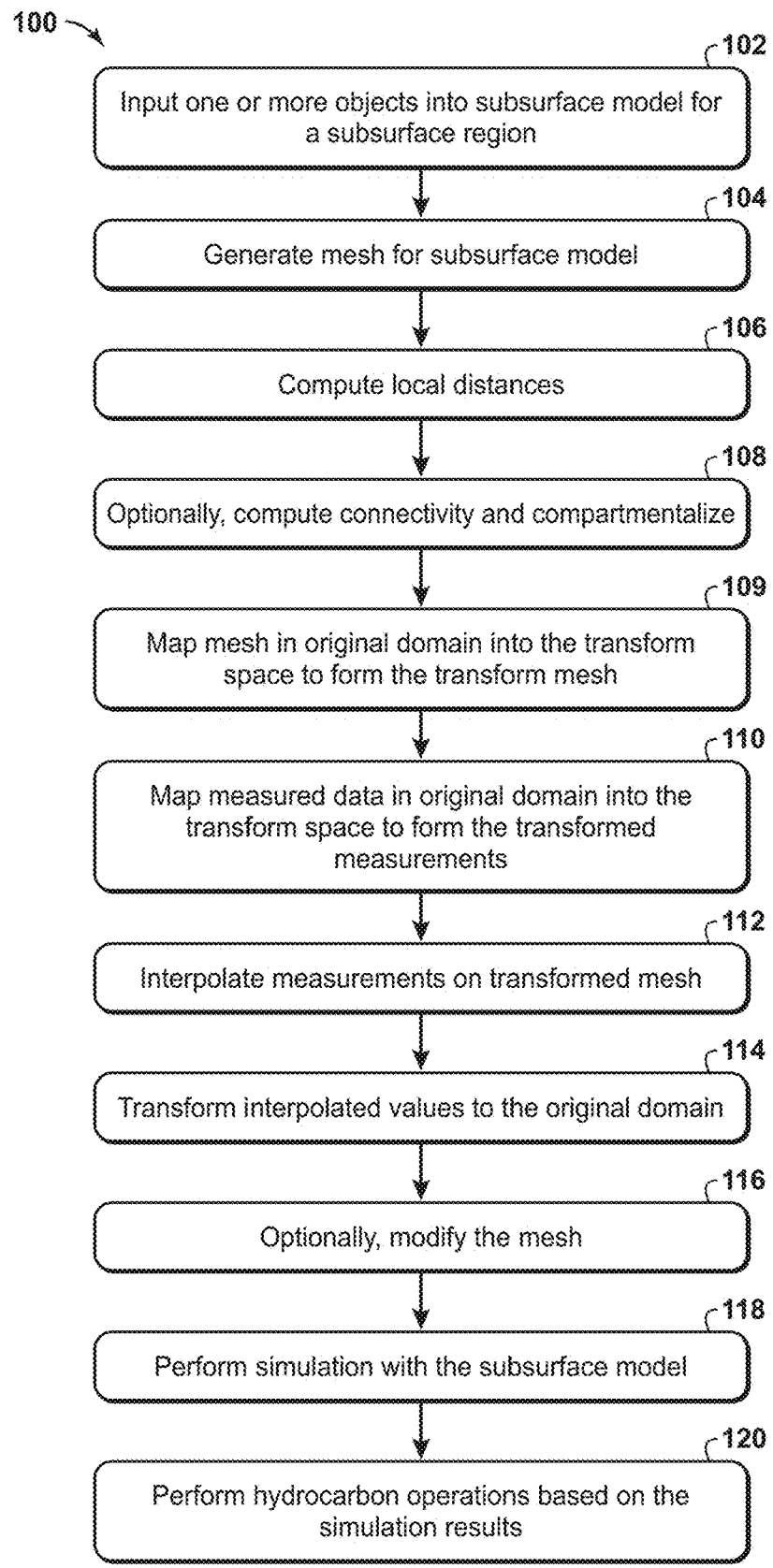
FIG. 1 is an exemplary flow chart in accordance with an embodiment of the present techniques.

In the following detailed description section, the specific embodiments of the present disclosure are described in connection with preferred embodiments. However, to the extent that the following description is specific to a particular embodiment or a particular use of the present disclosure, this is intended to be for exemplary purposes only and simply provides a description of the exemplary embodiments. Accordingly, the disclosure is not limited to the specific embodiments described below, but rather, it includes all alternatives, modifications, and equivalents falling within the true spirit and scope of the appended claims.

Various terms as used herein are defined below. To the extent a term used in a claim is not defined below, it should be given the broadest definition persons in the pertinent art have given that term as reflected in at least one printed publication or issued patent.

The articles "the", "a" and "an" are not necessarily limited to mean only one, but rather are inclusive and open ended so as to include, optionally, multiple such elements.

As used herein, the term "hydrocarbons" are generally defined as molecules formed primarily of carbon and hydrogen atoms such as oil and natural gas. Hydrocarbons may also include other elements or compounds, such as, but not limited to, halogens, metallic elements, nitrogen, oxygen, sulfur, hydrogen sulfide ($H_2S$) and carbon dioxide ($CO_2$). Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof. Hydrocarbons may be located within or adjacent to mineral matrices within the earth, termed reservoirs. Matrices may include, but are not limited to, sedimentary rock, sands, silicilytes, carbonates, diatomites, and other porous media.

As used herein, "hydrocarbon exploration" refers to any activity associated with determining the location of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models and determining the likely locations for hydrocarbon reservoirs within the subsurface. The measurement data may include seismic data, gravity data, magnetic data, electromagnetic data and the like.

As used herein, "hydrocarbon development" refers to any activity associated with planning of extraction and/or access to hydrocarbons in subsurface regions. Hydrocarbon development normally refers to any activity conducted to plan for access to and/or for production of hydrocarbons from the subsurface formation and the associated modeling of the data to identify preferred development approaches and methods. By way of example, hydrocarbon development may include modeling of the subsurface formation and extraction planning for periods of production; determining and planning equipment to be utilized and techniques to be utilized in extracting the hydrocarbons from the subsurface formation and the like.

For the purpose of this disclosure, the terms extrapolation and interpolation both denote the construction of new data points from a discrete set of known data points.

For the purpose of this disclosure, a surface is a two-dimensional mesh embedded in a three-dimensional space. The two-dimensional mesh is formed from nodal points that form a point cloud, and an unstructured mesh where the nodes form polygons, or a structured mesh where mesh faces are defined by multiple enumerations of the nodes. A surface may consist of one or multiple pieces and may or may not contain holes. The surface may be single valued or multi-valued where the same x-y location has multiple z-values.

For the purpose of this disclosure, a transform domain is the coordinate frame or metric space in which the measurements are interpolated. Often, the transform domain will be a space with more than three dimensions.

For the purpose of this disclosure, an original domain is the coordinate frame where the measurements where made as well as the domain of the surface, mesh, or grid. Often, the original domain is the three-dimensional xyz (or xyt) domain. The original domain, however, could be of a dimensionality different than three. For example, the original domain could be four dimensional where every measurement has location xyz and time t components.

As used herein, "hydrocarbon operations" refers to any activity associated with hydrocarbon exploration, hydrocarbon development and/or hydrocarbon production.

As used herein, "hydrocarbon production" refers to any activity associated with extracting hydrocarbons from subsurface location, such as a well or other opening. Hydrocarbon production normally refers to any activity conducted to form the wellbore along with any activity in or on the well after the well is completed. Accordingly, hydrocarbon production or extraction includes not only primary hydrocarbon extraction, but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

As used herein, "subsurface model" refers to a reservoir model, geomechanical model, watertight model and/or a geologic model. The subsurface model may include subsurface data distributed within the model in two-dimensions (e.g., distributed into a plurality of cells, such as elements or blocks), three-dimensions (e.g., distributed into a plurality of voxels) or three or more dimensions.

As used herein, "geologic model" is three-dimensional model of the subsurface region having static properties and includes objects, such as faults and/or horizons, and properties, such as facies, lithology, porosity, permeability, or the proportion of sand and shale.

As used herein, "reservoir model" is a three-dimensional model of the subsurface that in addition to static properties, such as porosity and permeability, also has dynamic properties that vary over the timescale of resource extraction, such as fluid composition, pressure, and relative permeability.

As used herein, "zone", "structural blocks", "region", "container", or "compartment" is a defined space, area or volume contained in the framework or model, which may be bounded by one or more objects. The volume may include similar properties. The reservoir model may be vertically split into a set of mutually exclusive zones bound by stratigraphic surfaces. The reservoir model may be laterally split into structural blocks bound by fault surfaces. The intersection of a zone and a structural block forms a compartment. A container is a three-dimensional subvolume of the model. A region is a contiguous two- or three-dimensional part of the model.

As used herein, "mesh" or "grid" is a representation of a region of space (e.g., 2-D domain or 3-D domain), which may include objects, and includes two or more nodes and a set of polygons or polyhedra disposed within the region (e.g., a volumetric representation). The mesh may represent each object by a set of polygons or polyhedra disposed within the region. Properties may be assigned to some or all polygons. A mesh may include nodes, edges, faces, and in some cases, cells.

As used herein, a property is a categorical, discrete, or continuous attribute assigned to mesh elements (e.g., nodes, faces, edges, or cells). Example properties include coordinates (x, y, z, or t), static properties (e.g., rock type, porosity, permeability), or dynamic properties (e.g., pressure or fluid composition). The methods disclosed herein are extended from node properties to other mesh elements by consideration of dual graphs or dual meshes that permute the meaning of nodes, faces, edges, and cells. Cell properties, for example, are considered by interchanging cells and nodes for each other by formation of a dual graph.

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve performing by execution of a reservoir-simulator computer program on a processor, which computes composition, pressure, or movement of fluid as function of time and space for a specified scenario of injection and production wells by solving a set of reservoir fluid flow equations. A geomechanical simulation may involve performing by execution of a geomechanical simulator computer program on a processor, which computes displacement, strain, stress, shear slip, energy release of the rock as a function of time and space in response to fluid extraction and injection.

In hydrocarbon operations, a subsurface model is created in the physical space or domain to represent the subsurface region. The subsurface model is a computerized representation of a subsurface region based on geophysical and geological observations made on and below the surface of the Earth. The subsurface model may be a numerical equivalent of a three-dimensional geological map complemented by a description of physical quantities in the domain of interest. The subsurface model may include multiple dimensions and is delineated by objects, such as horizons and faults. The subsurface model may include a structural framework of objects, such as faults and horizons, and may include a mesh or grid of nodes to divide the structural framework and/or subsurface model into cells, which may include mesh elements or blocks in two-dimensions, mesh elements or voxels in three-dimensions or other suitable mesh elements in other dimensions. A cell, such as block, mesh element or voxel, is a subvolume of the space, which may be constructed from nodes within the mesh. In the subsurface model, material properties, such as rock properties (e.g., permeability and/or porosity), may be represented as continuous volumes or unfaulted volumes in the design space, while the physical space may be represented as discontinuous volumes or faulted volumes (e.g., contain volume discontinuities, such as post-depositional faults).

Within the subsurface models, a grid or mesh may be used to partition the model into different subvolumes, which may be used in hydrocarbon operations, such as reservoir simulation studies in reservoir exploration, development and/or production stages, as well as for representing a subsurface model description of a reservoir structure and material properties. Accordingly, the mesh may be configured to form cells that may represent material properties, such as rock and fluid properties, of a reservoir or may be used for numerical discretization of partial differential equations, such as fluid flow or wave propagation.

However, faults are discontinuities in the subsurface regions, which are difficult to handle in subsurface models. As noted above, conventional approaches do not interpolate in a multidimensional transform space and typically convert a discontinuous three-dimensional space to more continuous three-dimensional space. In addition, the other approaches are based on solving a differential equation that involve specification of boundary conditions on the fault discontinuities and model boundaries which limits flexibility. As a result, these approaches are computationally costly.

In contrast, the present techniques provide various enhancements. For example, the present techniques interpolate over discontinuous objects, while preserving flexibility of the interpolation method used. Further, the present techniques involve transforming a discontinuous object into a metric space. By way of example, the present techniques embeds the surface and/or model in a high-dimensional space that preserve distance in continuous regions, but significantly increases (e.g., exaggerates) distance across discontinuities. Then, traditional distance-based interpolation may be applied without special consideration for discontinuities or visibility because the amplified distance lessens or eliminates the impact of distance measurements from across discontinuities. As a result, the interpolation in this high-dimensional space is both efficient and flexible. In a preferred embodiment, this space has a dimensionality of three plus the number of discontinuities (e.g., faults).

Certain aspects of the present techniques are described by using the example of discontinuous surfaces and/or discontinuous meshes. However, as may be appreciated this is not meant as a limitation, but rather as an illustration of the present techniques. Further, the present techniques may be applied to continuous or discontinuous objects. The present techniques may apply to interpolations along polylines, surfaces, grids, or meshes. It may be advantageous to apply the present techniques to discontinuous objects where other methods fail or do not provide satisfactory results.

Further, in certain embodiments, the penalty for crossing a discontinuity is incorporated in the distance by distorting space in such a way that distances across discontinuities are significantly amplified (e.g., by a factor of radicand 2 or more), while distances within continuous regions are preserved. This factor is not a specified parameter but rather an implicit parameter that results from the multidimensional embedding and its dimensionality. A traditional metric or distance measure such as the Manhattan distance or a Euclidian distance can be used in this distorted space.

The present techniques may be utilized to enhance the creation of a subsurface model. The subsurface model, which may include a reservoir model, geomechanical model, or geologic model, is a computerized representation of a subsurface region based on geophysical and geological observations associated with at least a portion of the specified subsurface region. Subsurface models, such as reservoir models, are typically used as input data for reservoir simulators or reservoir simulation programs that compute predictions for the behavior of rocks and fluids contained within a subsurface region under various scenarios of hydrocarbon recovery. Using subsurface models in simulations provides a mechanism to identify which recovery options offer the most economic, efficient, and effective development plans for a subsurface region (e.g., a particular reservoir and/or field).

Construction of a subsurface model is typically a multistep process. Initially, a structural model or structural framework is created to include objects (e.g., surfaces, such as faults, horizons, and if necessary, additional surfaces that bound the area of interest for the model). The different objects define closed volumes, which may be referred to as zones, subvolumes, structural blocks, compartments and/or containers. Then, a plurality of regions is meshed or partitioned into sub-volumes (e.g., cells, mesh elements or voxels) defined by a mesh (e.g., a 3-D mesh or 3-D grid). Once the partitioning is performed, properties are assigned to objects (e.g., transmissibility) and individual sub-volumes (e.g., rock type, porosity, permeability, rock compressibility, or oil saturation). The objects (e.g., surfaces) are represented as meshes, while the cells form a mesh.

The assignment of cell properties is often also a multistep process where cells are assigned properties. For example, each cell may first be assigned a rock type, and then each rock type is assigned spatially-correlated reservoir properties and/or fluid properties. Each cell in the subsurface model may be assigned a rock type. The distribution of the rock types within the subsurface model may be controlled by several methods, including map boundary polygons, rock type probability maps, or statistically emplaced based on concepts. Further, the assignment of properties, such as rock type assignments, may be conditioned to well data.

Further, the reservoir properties may include reservoir quality parameters, such as porosity and permeability, but may include other properties, such as clay content, cementation factors, and other factors that affect the storage and deliverability of fluids contained in the pores of the rocks. Geostatistical techniques may be used to populate the cells with porosity and permeability values that are appropriate for the rock type of each cell. Rock pores are saturated with groundwater, oil or gas. Fluid saturations may be assigned to the different cells to indicate which fraction of their pore space is filled with the specified fluids. Fluid saturations and other fluid properties may be assigned deterministically or geostatistically.

Actual property measurements are typically only available at a few locations. In order to assign properties to objects, these measurements need to be interpolated In the present techniques, an inputted mesh and the actual measurements may be transformed from the original domain into another space or domain, such as the transform space. The transformation of the inputted mesh (surface or volume) and inputted data (measurements) to the transform space may be performed in a manner that preserves local distances between the surface nodes, but exaggerates distances when nodes are separated by a discontinuity. Preferably, a connectivity calculation is performed to determine whether nodes are directly connected. For example, one configuration may involve computing an adjacency matrix to determine whether any two nodes are directly connected or are not directly connected. Another configuration may involve computing a weighted adjacency matrix to determine whether any two nodes are directly connected, and if they are connected, the distance and/or length of connection may be determined and stored. The calculated distance may be the distance of the nodes in the original domain. The distance calculations, for example, may be Manhattan distance, Euclidian distance, a combination thereof or another suitable distance calculation. In addition, the weighted adjacency matrix may be expanded to a full distance-matrix that contains the shortest distance for any pair of nodes or a special marker, such as zero, NaN (not a number), or Inf (infinity) if there is no path along the mesh from a first node to a second node.

In other configurations, a method of manifold learning may be used to create a high-dimensional space from one of an adjacency matrix, a weighted adjacency matrix, and/or a distance matrix. Manifold learning is an approach to perform non-linear dimensionality reduction. Algorithms for this approach are based on the premise that the dimensionality of many data sets is only artificially high, and that these data sets may be projected to a lower-dimensional space. However, in the present techniques, the manifold learning is utilized to map from the lower-dimensionality original domain to the higher dimensionality transform domain. As a result, the present techniques seemingly increase the dimensionality to provide more separation of discontinuous portions of a surface (e.g., or manifold in a low-dimensional space). The methods of manifold learning or non-linear dimensionality reduction may include Sammon's mapping, self-organizing maps (SOM), principal curves and manifolds, autoencoders, Gaussian process latent variable models, curvilinear component analysis, curvilinear distance analysis, diffeomorphic dimensionality reduction, kernel principal component analysis (KPCA), Isomap, locally-linear embedding, Laplacian eigenmaps, manifold alignment, diffusion maps, Hessian locally-linear embedding (Hessian LLE), modified Locally-Linear Embedding (MLLE), relational perspective map, local tangent space alignment, local multidimensional scaling, maximum variance unfolding, nonlinear PCA, data-driven high-dimensional scaling, manifold sculpting, t-distributed stochastic neighbor embedding, RankVisu, and/or topologically constrained isometric embedding. Each of the methods may provide a mechanism to compute a multi-dimensional domain from the inputted mesh and transformation of its (surface) nodes into this resulting multi-dimensional space.

In certain configurations, a method based on proximity or distance matrices may be preferred. A method of manifold-learning based on proximity matrices involves presenting the data to the algorithm in the form of a similarity matrix or a distance matrix rather than absolute locations. The advantage of distance matrices is that they can be formed from the lengths of the mesh edges which explicitly account for discontinuities because a discontinuity does not create an edge. While the methods are metric multidimensional scaling methods, the preferred methods may include Isomap, locally linear embeddings, maximum variance unfolding, and Sammon's mapping. Other preferred methods may include diffusion maps and kernel PCA (KPCA).

For example, Isomap is one representative of isometric mapping methods, and extends metric multidimensional scaling (MDS) by incorporating the geodesic distances imposed by a weighted graph. The classical scaling of metric MDS performs multi-dimensional embedding based on the pairwise distance between data points, which is generally measured using straight-line Euclidean distance. Isomap is distinguished by its use of the geodesic distance induced by a neighborhood graph embedded in the classical scaling. This is performed to incorporate a manifold structure in the resulting embedding. The Isomap defines the geodesic distance to be the sum of edge weights along the shortest path between two nodes (e.g., computed using Dijkstra's algorithm, for example). The top M eigenvectors of the geodesic distance matrix, represent the coordinates in the new M-dimensional Euclidean (transform) space. M is an inputted parameter for the desired number of dimensions of the transform space.

At a high level, classical Isomap determines the neighbors of each inputted data point and constructs a neighborhood graph (e.g., weighted adjacency matrix), computes the shortest distance between any two nodes, and computes a multi-dimensional embedding. In the present techniques, the inputted surface mesh defines the neighbors, and thus for the purpose of Isomap, the neighbors are predetermined and the neighborhood graph is at least partially precomputed. Preferably, the precomputed neighbors are converted to a proper neighborhood graph (e.g., adjacency matrix) and augmented with edge distances (e.g., weighted adjacency matrix). Given neighbors and their distances, the shortest distance between node pairs are computed using Dijkstra's algorithm, Floyd-Warshall algorithm, and/or another suitable algorithm. Then, a multidimensional embedding or transformation is computed using multidimensional scaling. For the purpose of this disclosure, "embed" denotes placing an object in a different space, e.g., moving a mesh from the original domain to the transform domain. The result is a mapping of each node from the original domain to a multidimensional space, e.g., the transform domain.

Mapping a node to the multidimensional space involves specification of the dimensionality M of the multidimensional space. A preferred dimensionality for the transform space is the dimensionality of the inputted mesh plus the number of discontinuities. For example, to interpolate on a three-dimensional mesh in the presence of five faults, eight-dimensional transform space (e.g., number of dimensions plus the number of faults) may be used. Specifying one dimension for each fault provides a mechanism for each discontinuity to expand or distort in its own dimension and completely independent of each other. It may be advantageous, however, to specify the dimensionality of the transform space to be lower than the dimensionality of the inputted mesh plus the number of discontinuities. Typically, discontinuities do not interact and multiple discontinuities may expand or distort in the same dimension. It may be advantageous to interpret the dimensionality of the inputted mesh plus the number of discontinuities as an upper bound on the dimensionality of the transform space to reduce computational effort.

It may be counterintuitive to use a dimensionality-reduction algorithm to embed a surface in a multi-dimensional space; the number of dimensions appears to be increasing. A surface exists in a three-dimensional geometrical space and forms a two-dimensional manifold therein. A grid exists in a three-dimensional geometrical space. Neither surface nor grid, however, are low-dimensional objects because they have topology. For a mesh formed by P nodes, numerous topologies may be defined by selecting connections or edges that form faces and cells. It is irrelevant that most edge selections may not define well-formed meshes. For a mesh formed by P nodes, the dimensionality is on the order of P. A typical surface formed by 10,000 points has a dimensionality around 10,000. A typical grid formed by 1,000,000 points has a dimensionality around 1,000,000. Accordingly, it is the size of the distance matrices (e.g., weighted distance matrices) that define the dimensionality and the embedding in the multi-dimensional space. Geometry is only used to weight the connections in the distance matrices. Accordingly, embedding the mesh into a multi-dimensional transform space is a dimensionality reduction effort.

To enhance the subsurface model building process, the present techniques provide enhancements to the creation and generation of subsurface models. In one configuration, a method for generating a subsurface model for a subsurface region is described. The method may comprise: creating a mesh for a subsurface region in an original domain; computing connectivity and compartmentalization of the mesh; transforming the mesh into a transform domain wherein the transform domain is configured to exaggerate distance across discontinuities; transforming measured data into the transform domain; interpolating the measured data to a mesh in the transform domain; transforming the interpolated measurements to the original domain; and outputting the interpolated mesh and/or measurements in the original domain.

In other configurations, various enhancements may be described. For example, the method may include wherein dimensionality of the created mesh plus the number of discontinuities may be an upper bound on the dimensionality of the transform domain; wherein the transforming mesh into the transform domain my further comprise preserving local distances between surface nodes in the mesh, but exaggerates distances when nodes are separated by a discontinuity; wherein the distance may be computed based on a Manhattan distance that is computed by propagating the distance from a first surface node to a second surface node; wherein the distance may be computed based on a Euclidian distance that is computed between a first surface node to a second surface node; building a reservoir model from the interpolated mesh and assigning properties to the mesh elements of the interpolated mesh; wherein the properties comprise one or more of porosity, permeability and any combination thereof; simulating fluid flow within the reservoir model to create simulation results; wherein the measured data are either at least one component of the mesh coordinates or a categorical, discrete, or continuous property attributed to mesh nodes; managing hydrocarbon operations based on the simulation results.

Beneficially, the present techniques provide various enhancements to the hydrocarbon extraction process. In some embodiments, the present techniques are used to perform discontinuous interpolation across discontinuities, for example, to interpolate pressure within spatially adjacent compartments without crossing the compartment boundary. In the present techniques, interpolations are performed in a multidimensional transform space to interpolate data values or measurements objects that are discontinuous in the original domain. Because discontinuities in the original domain (e.g., faults) are addressed in the transformation, they do not need to be considered in the actual interpolation which provides flexibility in the selection of the interpolation method used. In some embodiments, the present techniques are also used to perform continuous interpolation across discontinuities by embedding the originally discontiguous regions in a transform space where they are contiguous. Again, the discontinuities are addressed in the transformation and do not need to be considered in the actual interpolation step. The present techniques may be further understood with reference to FIGS. 1 to 8, which are described further below.

In a preferred embodiment, the inventive method is used to assign properties by interpolation of specified measured properties to the cells or nodes of a surface mesh or volumetric grid. In another preferred embodiment, a surface is constructed by assigning depth values to the nodes of a surface mesh by interpolation from specified depths at specified locations. In the prior case, the grid or mesh is formed from nodes that have x, y, and z coordinates and the cells or elements are mutually exclusive. In the latter case, the mesh is formed from nodes that only have two out of three coordinates. Typically, the z coordinate is missing.

FIG. 1 is an exemplary flow chart 100 in accordance with an embodiment of the present techniques. Two kinds of data, first data is used to build the model (e.g., mesh, grid, etc.), while a second kind of data is the measure data (e.g., pressure, rock type etc.). One issue is that a surface may be constructed with this process where depth values are known at only a few locations. The surface mesh has no z values, but only x and y values. Nevertheless, the surface is transformed and the few z values are interpolated in the transform domain to result in a complete surface after back transformation. The flow chart 100 includes a method for creating a subsurface model and using the created subsurface model for hydrocarbon operations. The method may include obtaining data and creating a subsurface model for the subsurface region, as shown in blocks 102 to 106. Then, the enhancements of the present techniques may be performed on subsurface model to interpolate specified measured data over discontinuous objects, as shown in blocks 108 to 116. The measured data is typically sparse and originating from wells or seismic surveys. Finally, the subsurface model may be used to perform simulations and for hydrocarbon operations, as shown in blocks 118 and 120.

To begin, the method involves obtaining data and creating a subsurface model for the subsurface region, as shown in blocks 102 to 106. At block 102, one or more objects are inputted into a subsurface model for a subsurface region. The inputting of the objects may include inputting one or more surfaces, horizons, faults, and model boundaries into the subsurface model. Then, a mesh is generated for the subsurface model, as shown in block 104. A three-dimensional mesh is typically created using conventional software. Unless the property to be interpolated is depth (or two-way travel time), then a two-dimensional mesh is typically generated using industry-standard software. If edges or cells still cross specified discontinuities, then these cells or edges are removed. If the property to be interpolated is depth or travel time, then the two-dimensional mesh may need to be custom made by neglecting depth. For example, the mesh may be a regular grid with an origin, cell sizes, and specified cell numbers. As another example, the mesh may be a regular grid with an origin, an end point, and specified cell numbers. In either configuration, cells or edges that cross specified discontinuities are removed. As another example, the mesh may be generated using an industry standard mesh generator that fills a specified polygon with a specified number of nodes and forms a mesh from polygon and nodes. In some cases, it may be necessary to remove cells or edges crossing specified discontinuities. For multivalued surfaces, a specialized mesh generator may need to be used to form a mesh without the explicit use of depth (as depth is yet specified at a few select locations only).

In block 106, local distances between nodes are computed for a plurality of edges for the specified meshes. Local node distance is defined as the edge length computed using a specified distance measure. A preferred measure is the Euclidian measure yielding the Cartesian distance. Any other distance measure such as the Manhattan distance could be used. Preferably, the local distances are entered into a distance matrix that stores the distance between nodal pairs. In some embodiment, the distance matrix is sparse because distances are only entered between nodes that share an edge. In other embodiments, the distance matrix is extended to a plurality of nodal pairs by application of minimal distance algorithm to the graph encoded in the distance matrix. In some embodiments, this extension is performed as part the manifold learning performed in block 109.

Further, in certain configurations, the inputting of the one or more objects may include inputting measurements to be interpolated and the surface over which the measurements are to be interpolated. Typically, these measurements originate from wells (or seismic) data. Often, there are few of these measurements. These measurements are sparse in comparison to the number of mesh elements. For exemplary purposes, the interpolation on a discontinuous surface is described further below in FIGS. 2 to 4. The example shows the assignment of a property to the entire surface from just a few measurements at points that the surface intersects. However, the present techniques may also be utilized for interpolation on a volumetric grid or interpolation on a tree structure, or in general any N-dimensional mesh embedded in a D-dimensional space where D is greater than or equal to ($\geq$) N.

Then, the present techniques interpolate over discontinuous objects, as shown in blocks 108 to 116. In block 108, connectivity and compartmentalization may optionally be computed. Preferably, connectivity and compartmentalization are computed from the weighted distance matrix. The computation of the connectivity of the inputted mesh may involve applying connected-component analysis or connected-component labeling of the mesh, while the compartmentalization of the inputted mesh may involve extraction of individual connected components or uniquely labelled components from the matrix and formation of submeshes for said components. Preferably, said submeshes are represented as weighted distance matrices.

Then, the inputted mesh may be transformed into another space or domain, such as the transform space. At block 109, the mesh in original domain is mapped into the transform space to form the transform mesh. The mesh may be embedded into the transform space by a manifold learning algorithm or metric multidimensional scaling. The transformation of the inputted mesh (or submesh) to the surface (or mesh or submesh) to the transform space is performed in a manner that preserves local distances between the surface nodes, but exaggerates distances when nodes are separated by a discontinuity. Preferably, a connectivity calculation is performed to determine whether nodes are directly connected. For example, one configuration may involve computing an adjacency matrix to determine whether any two nodes are directly connected or are not directly connected. Another configuration may involve computing a weighted adjacency matrix to determine whether any two nodes are directly connected, and if they are connected, their distance or length of connection. The calculated distance may be the distance of the nodes in the real space (e.g., original domain). For example, the distance calculations may be Manhattan distance, Euclidian distance and/or a combination thereof. In addition, the weighted adjacency matrix may be expanded to a full distance-matrix that contains the shortest distance for any pair of nodes or a special marker such as 0, NaN (not a number), or Inf (infinity) if there is no path along the mesh from a first node to a second node. Preferably, the local distances or weighed distance matrices computed in blocks 106 or 108 are reused for computational efficiency rather than computing them anew. Preferred manifold learning algorithms use a weighted distance matrix as their input. The preferred algorithms may include Isomap, locally linear embeddings, maximum variance unfolding, and Sammon's mapping. Other preferred methods may include diffusion maps and kernel PCA (KPCA). Some embodiments may use a manifold learnings algorithm that uses node coordinates or other data as their inputs. Also, mapping a node to the multidimensional space involves specification of the dimensionality of the multidimensional space. A preferred dimensionality for the transform space is the dimensionality of the inputted mesh plus the number of discontinuities, as noted above.

Then, in block 110, the measured data are mapped to the transform domain. In some embodiment, the measured data are located on mesh nodes and the measured data map with the nodes. In other embodiments, the measured data are not located on original mesh nodes, but the meshes are modified as part of block 104 by insertion of appropriate nodes. In yet another embodiments, the measurements are transferred onto at least one nearby mesh node, where nearby is determined using a specified distance measure. Preferably, the same distance measure is specified as used in blocks 106 or 109. In one preferred embodiment, the measurements are transferred to the closest mesh node. In another preferred embodiment, the measurements are transferred to a specified number of nearby mesh nodes using an interpolation algorithm such as nearest-neighbor, linear interpolation, least-squares, spline interpolation, kriging, or radial basis functions. Then, as shown in block 112, the transformed mesh may be interpolated. For example, the inputted measurements are interpolated on the transformed mesh in the transform space. The interpolation may be performed in the multidimensional space, which may include interpolation methods such as linear interpolation, nearest neighbor interpolation, radial-basis function (RBF) interpolation, kriging, spline interpolation, or least-squares interpolation based on a differential operator such as the Laplace or biharmonic operator.

By performing the interpolation on the transform mesh, any interpolation algorithm may be used because the difficulties caused by the discontinuities are removed. The transform domain moves nodes and data separated by a discontinuity far apart such that simple distance measures without concern for discontinuities can be using in interpolation. At block 114, the interpolated mesh may be output. The interpolated values are transformed to the original domain. In a preferred embodiment, the interpolated values are simply transferred from the nodes in the transfer domain to the corresponding nodes in the original domain. The output of the interpolated mesh may further include storing the interpolated mesh in memory or displaying the interpolated mesh. In block 116, the mesh may optionally be further modified. The further modification of the interpolated mesh may involve moving certain meshes, join or delete small mesh elements (e.g., mesh elements below a specific threshold of an element quality metric), performing filtering or other processing on the mesh to address pinchouts and/or improperly formed mesh elements, for example. Further, the modifications may include user adjustments or performing algorithms to change the order of objects or deform and/or reposition one or more objects. The modified mesh may be utilized as the subsurface model and/or may be utilized to create a simulation mesh (e.g., upscaled) for use in simulations. As may be appreciated, the modifications to the interpolated mesh may be visualized for interpretation and quality control.

Once properties are assigned, the subsurface model may be augmented with other methods to form a complete reservoir model utilized to perform simulations and the model and associated results may be used for hydrocarbon operations, as shown in blocks 118 and 120. The augmentation may include the assignment of properties to cells associated with one or more objects or other individual sub-volumes. The properties may include transmissibility, rock type, porosity, permeability, rock compressibility, oil saturation, clay content and/or cementation factors, for example. The assignment of properties may include geostatistical techniques to populate the cells with property values that are appropriate for the cells. The properties assigned to the cells of the subsurface model may depend on the type of subsurface model, such as a reservoir model. At block 118, a simulation is performed with the subsurface model. The subsurface model may be a reservoir model or a geologic model and may be utilized to provide simulation results. The performing the simulation may include modeling fluid flow based on the reservoir model and the associated properties stored within the cells of the reservoir model. The simulation results may include the computation of time-varying fluid pressure and fluid compositions (e.g., oil, water, and gas saturation) and the prediction of fluid volumes produced or injected at wells. The performing the simulation may include modeling structural changes based on the geologic model and the associated properties stored within the cells of the geologic model. For example, reducing reservoir pressure may reduce porosity which may lead to a sagging overburden. The simulation results and/or the reservoir model may be outputted. The outputting of the simulation results and/or the subsurface model may include displaying the simulation results, the geologic model and/or the reservoir model on a monitor and/or storing the simulation results, the geologic model and/or the reservoir model in memory of a computer system. At block 120, the simulation results may be utilized to perform hydrocarbon operations. The hydrocarbon operations may include hydrocarbon exploration operations, hydrocarbon development operations and/or hydrocarbon production operations. For example, the simulation results, the geologic model and/or the reservoir model may be used to estimate or adjust reserves forecasts, reserves estimations and/or well performance prediction. As another example, the simulation results, the geologic model and/or the reservoir model may be used to adjust hydrocarbon production operations, such as installing or modifying a well or completion, modifying or adjusting drilling operations, decreasing fracture penetration, and/or to installing or modifying a production facility. The production facility may include one or more units to process and manage the flow of production fluids, such as hydrocarbons and/or water, from the formation.

Beneficially, this method provides an enhancement in the production, development and/or exploration of hydrocarbons. In particular, the method may be utilized to enhance development of a reservoir model by providing attributed surfaces with less computational effort, less interactive intervention, and/or in a computationally efficient manner. As a result, this may provide enhancements to production at lower costs and lower risk.

As may be appreciated, the blocks of FIG. 1 may be omitted, repeated, performed in a different order, or augmented with additional steps not shown. Some blocks may be performed sequentially, while others may be executed simultaneously or concurrently in parallel. For example, in certain embodiments, disconnected elements of the inputted objects (e.g., surface) may form separate subspaces in the multi-dimensional space formed by the transformation in block 109. It may be advantageous perform blocks 109 (e.g., the transformation) and block 110 (e.g., the interpolation) independently for a plurality of the disconnected elements and accumulate the results in block 112 (e.g., the outputting of the results). The optional block 108 may assigns each surface node to surface segments or submeshes. If there are no discontinuities, then only one segment or mesh may exist. If a discontinuity does bisects the entire surface, then two segments may exist. A preferred embodiment of blocks 106 and 108 may first form a connectivity graph (e.g., adjacency graph) from local distances between neighboring nodes and then use a connected component labeling algorithm to assign each node to a surface segment. It may be advantageous to separate the connectivity graph into a plurality of connectivity graphs and utilize these piece-wise connectivity graphs in block 108.

Figure 2:
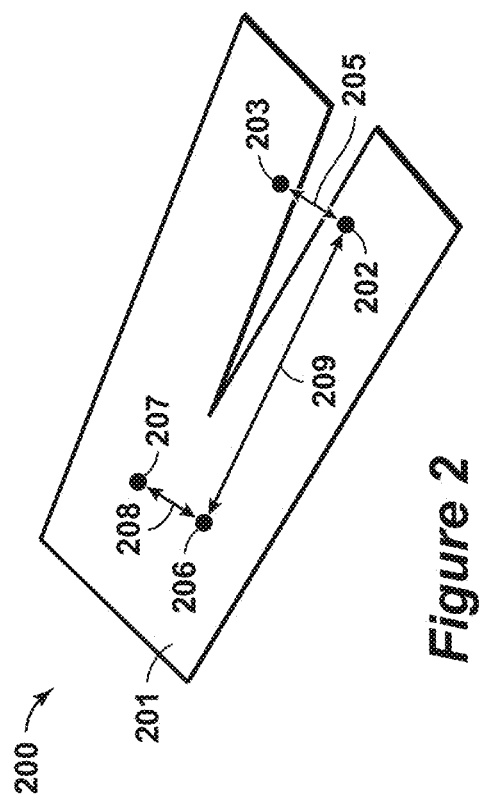
FIG. 2 is an exemplary diagram of a discontinuous surface and the distances between points.

FIG. 2 is an exemplary diagram 200 of a discontinuous surface 201 and the distances between points, such as points 202, 203, 206 and 207. In this diagram 200, a discontinuous surface 201 that is partially displaced by a fault. In this diagram 200, four points 202, 203, 206 and 207 are located on surface 201. Distances 208 and 209 between points 207, 206 and 202 do not require any special attention, as no discontinuities are present along those paths for the distances 208 and 209. A distance-based interpolation at point 206 using data from points 202 and 207 also does not pose a problem. Points 202 and 203, however, are separated by a discontinuity. The direct path 205 between 202 and 203 does not exist because of the discontinuity. A distance-based interpolation at point 202 using data from points 206 and 203 may yield unexpected results because data from point 203 may dominate the interpolation, even though points 202 and 203 are separated by the fault discontinuity.

Figure 3:
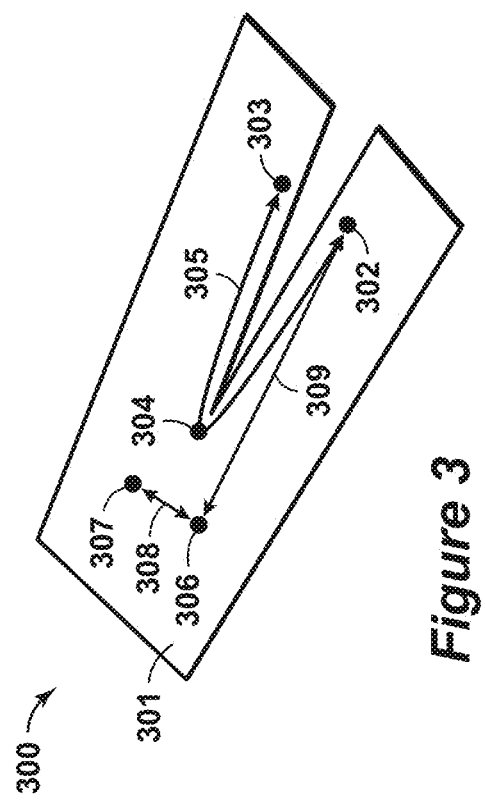
FIG. 3 is an exemplary diagram of a discontinuous surface with penalized distances between points.

FIG. 3 is an exemplary diagram 300 of a discontinuous surface with penalized distances between points. In this diagram 300, a solution to the discontinuous interpolation problem is provided. Distance-based interpolation at point 306 using data from point 307 and point 302 may be calculated in a manner similar to that above in FIG. 2. Interpolation at point 302 using data from points 306 and 303, however, is more complicated because there is no direct path between points 302 and 303 due to the interfering discontinuity. Instead, the path between 302 and 303 leads through point 304 by going around the discontinuity along path 305. Compared to the direct path and distance between points 302 and 303, path 305 represents a detour whose increased length penalizes data from point 303 when interpolating at point 302. As a result, computing and managing the detours or penalties in paths around discontinuities may create a computational burden on the interpolation.

Figure 4:
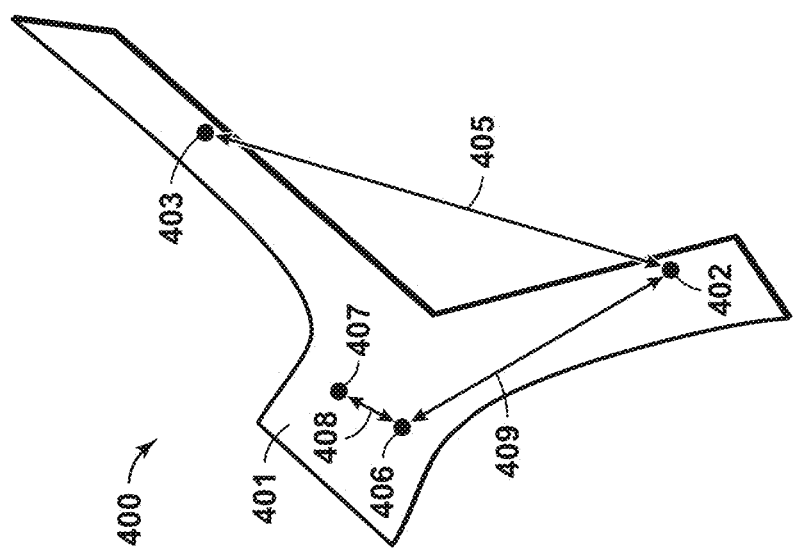
FIG. 4 is an exemplary diagram of a discontinuous, distorted surface with distances between points.

Accordingly, to address this problem, the surface may be transformed to another space or domain that exaggerates distances across discontinuities rather than interpolating in the real space of the surface. FIG. 4 is an exemplary diagram 400 of a discontinuous, distorted surface with distances between points, such as 402 and 403. A preferred method of transformation is embedding the surface in a higher-dimensional space. The originally two-dimensional surface is embedded in a three-dimensional space that adds an additional dimension that provides the two discontinuous regions to separate from each other. In a one embodiment of the present techniques, a dimension is added for each discontinuity in the original surface. For example, a surface with five discontinuities may be embedded in a seven dimensional space, which is the sum of the two original dimensions plus five additional dimensions for the five discontinuities.

In diagram 400 of FIG. 4, the two discontinuous parts of surface 401 are twisted apart, stretching the distance between points 402 and 403 (which are the points corresponding to points 202 and 203 of FIG. 2 and points 302 and 303 of FIG. 3). Rather than detecting the necessity and computation of detour path, such as detour path 305 of FIG. 3, the distance 405 may be computed with a traditional measure, such as the Manhattan distance or the Euclidian distance, between 402 and 403. Preferably, the distortion or transfer to another space does not change the distance 408 between points 406 and 407 from the original distance 208 between points 206 and 207 of FIG. 2. Preferably, distance 408 equals the distance 208 of FIG. 2 and similarly distance 409 should equal the distance 209 of FIG. 2. The distances may change slightly, but preferably, the changes between the original distances in the original domain and the distances in the transformed domain should be minimal (e.g., distances 208 and 408 and between distances 209 and 409 are minimal).

Figure 5:
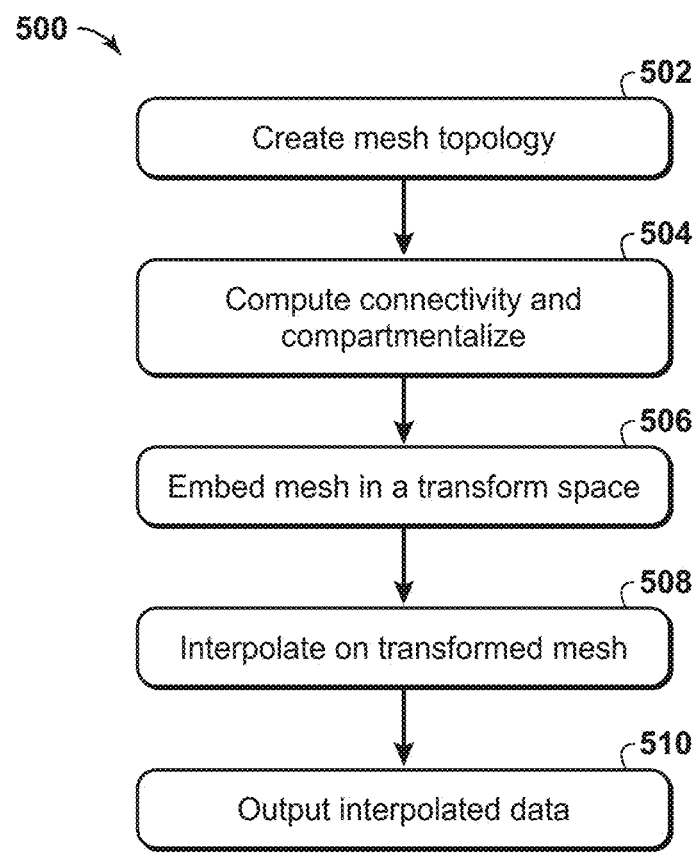
FIG. 5 is another exemplary flow chart in accordance with an embodiment of the present techniques.

FIG. 5 is another exemplary flow chart 500 in accordance with an embodiment of the present techniques. In this flow chart 500, a mesh topology is created, as shown in block 502. At block 504, connectivity and compartmentalization may be computed. Then, at block 506, the mesh is embedded in a transform space. This may involve computing distances within connected cliques. At block 508, perform interpolation on the transformed mesh. The interpolation may performed in the multidimensional space formed by block 506. Preferred interpolation methods include linear interpolation, nearest neighbor interpolation, radial-basis function (RBF) interpolation, kriging, spline interpolation, or least-squares interpolation based on a differential operator such as the Laplace or biharmonic operator. Finally, at block 510, output the interpolated data. The output of the interpolated data may be that the results of the interpolation are transferred back onto the original surface and may be used to perform a hydrocarbon operations, such as drill a well for the detection, delineation, or production of a resource, e.g., hydrocarbons.

It may be advantageous perform the transformation and interpolation independently for disconnected pieces and accumulate the results. An optional operation may involve assigning each surface node to surface segments, thus forming submeshes. If there are no discontinuities, then there may be only one segment. If a discontinuity does bisect the entire surface, then there may be two pieces. Another configuration may involve first forming a connectivity graph (e.g., an adjacency graph or weighted distance matrix) and then using a connected component labeling algorithm to assign each node to a surface piece. It may also be advantageous to separate said connectivity graph into a plurality of connectivity graphs and utilize these piece-wise connectivity graphs.

As shown in block 502, the creation of the mesh topology may involve the user specifying, inputting, or constructing a neighborhood graph (e.g., an adjacency matrix) that defines the mesh topology. By way of example, the user inputs mesh pieces that terminate at least on discontinuities. If two geographically adjacent pieces are not separated by a discontinuity, then the user may specify a list of nodal identities (e.g., a list of nodes that should be considered identical). By patching together mesh pieces like a three-dimensional puzzle, the user can generate a topology for arbitrary meshes.

Because the geometry of the mesh itself is to be constructed by interpolation, distance may be preferably computed from a subset of node coordinates. For the generation of a surface, distance might be based on the x- and y-coordinates of the nodes, while the z-coordinate constitutes the property that is formed by interpolation from specified points and their locations.

In another embodiment, only node points are inputted and the mesh may be constructed from these node points to provide interpolation of a specified quantity. Returning to the description of the Isomap algorithm, as an example of a dimensionality-reduction algorithm, a first step is the computation of a neighborhood graph. If the input is a mesh defined by at least its neighborhood graph, this step may be unnecessary. In the current example, however, a plurality of neighbors need to be determined for a plurality of nodes. Methods to determine the neighbors of a node are known to those skilled in the art as (unsupervised) nearest neighbor algorithms and include K nearest neighbors (KNN), k-dimensional (KD) trees, or ball trees. It may be advantageous to assume that the mesh does not overlap itself, for example, to assume the surface is single-valued without any overlap in depth. In a certain configurations, it is assumed that the mesh is single-valued and a mesh generator may be used to form a mesh, neighborhood graph, and potentially distances in one step. Preferred mesh generation algorithms include Delaunay triangulation, Fortune's algorithm, Ruppert's algorithm, or stretched grid methods. In some embodiment, the mesh may overlap itself because the surface implied by the inputted points is multivalued. An additional criterion, such as vertical distance or vertical separation, may be needed to determine whether two laterally nearby nodes are truly connected or are located on different sheets of the multivalued surface.

Figure 6:
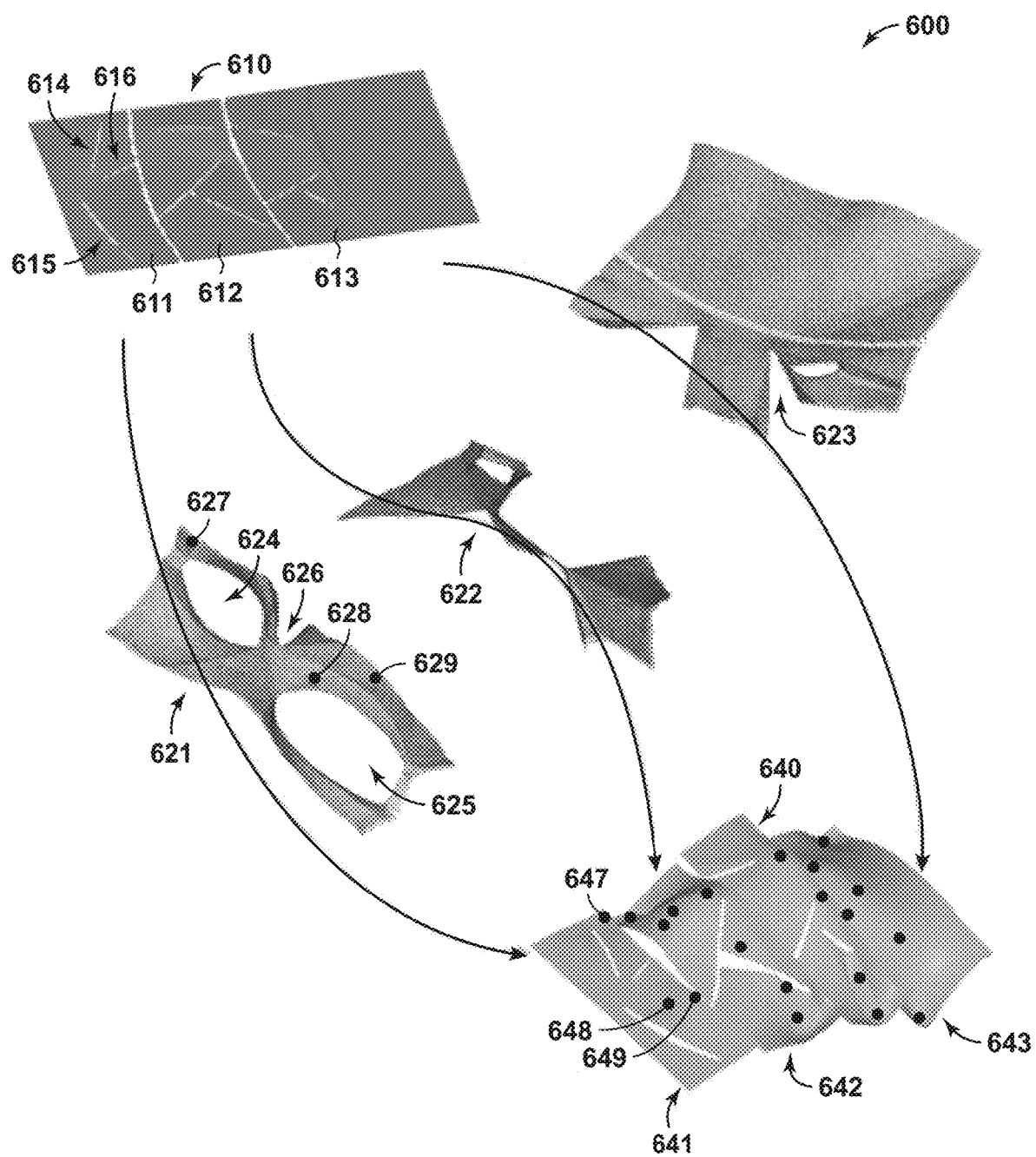
FIG. 6 is an exemplary diagram of the application of the present techniques in accordance with an embodiment of the present techniques.

FIG. 6 is an exemplary diagram 600 of the application of the present techniques in accordance with an embodiment of the present techniques. The diagram 600 demonstrates an exemplary application of the present techniques for the generation of a surface with discontinuities. For example, as an exemplary method of performing block 502 of FIG. 5, a mesh topology may be formed by first creating a regular grid and then removing nodes within the proximity of polylines representing discontinuities. The resulting mesh in graph 610 has nodes at specified x- and y locations, but their z-coordinates are set to zero. As noted in block 504 of FIG. 5, connectivity and compartmentalization may be computed. As an example, there are three disconnected mesh patches 611, 612, and 613 that may be determined. Each of the mesh patches 611, 612, and 613 is then mapped to a six-dimensional transformation space, as shown by performing block 506 of FIG. 5, which embeds the mesh into the transform space.

Because a six-dimensional space may not be readily visualized, each patch is projected from its six-dimensional transform space to a three-dimensional space for visualization resulting in graphs 621, 622, and 623. Visualization of the resulting objects in transform space and projection to lower-dimensional subspaces is an optional step in the present techniques.

The mesh in graph 610 contains multiple discontinuities, such as discontinuities 615, 616, and 617, which each relate to mesh patch 611. Discontinuities 615 and 616 are limited to the interior of mesh patch 611, while discontinuity 617 breaches the boundary of mesh patch 611. In the projected transform space, discontinuity 615 corresponds to discontinuity 625, discontinuity 616 to discontinuity 626, and discontinuity 617 to discontinuity 627. Their topologies remain unchanged. Discontinuity 625 and discontinuity 626 still form holes in graph 621, while discontinuity 627 still resembles a tear. In transfer space, however, the holes have opened up by distorting the meshes. Nodes on either side of the interior discontinuity are moved away from the discontinuity. The tear discontinuity 627 is very pronounced with the tips moving in opposite directions.

Three nodes on mesh patch 611 and other nodes on other patches have elevation data that the user wants to interpolate over the mesh to form a proper surface. In transform space, these nodes with data to be interpolated are labeled discontinuities 627, 628, and 629. The interpolation on transformed mesh, as shown in block 508 of FIG. 5, may be performed using a radial-basis-function (RBF) interpolator that propagates elevation values to the other nodes of mesh patch 611 and similarly for mesh patches 612 and 613. RBF interpolation is based on the distances between nodes with inputted and the nodes that are to be assigned values. In the present techniques, the distances may not be the distances in the original space, but the distances in the transfer space. Rather than using the distances between nodes of mesh element 611, the distances between nodes of graph 621 are used for interpolation.

Finally, the surface 640 after interpolation. The surface 640 includes three pieces 641, 642, and 643. The black dots (e.g., points 647, 648, and 649) on surface 640 denote the nodes that had initial elevations assigned. All black dots are intersected by the surface 640. The surface 640 exhibits smooth trends away from the black dots and sharp transitions at discontinuities.

Figure 7A:
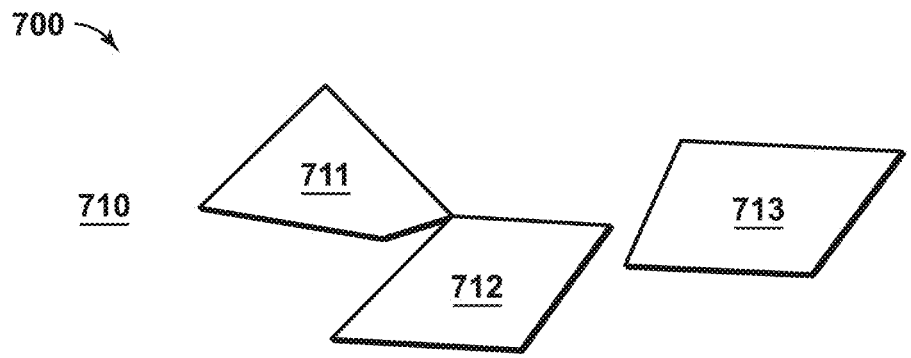
FIGS. 7A, 7B and 7C are exemplary diagrams associated with the closing of discontinuities for interpolation in accordance with an embodiment of the present techniques.
Figure 7B:
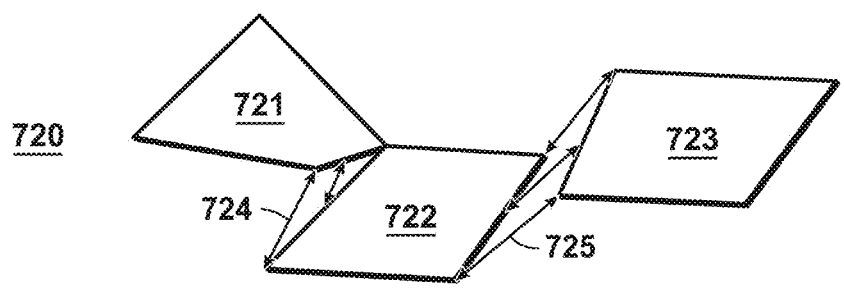
Figure 7C:
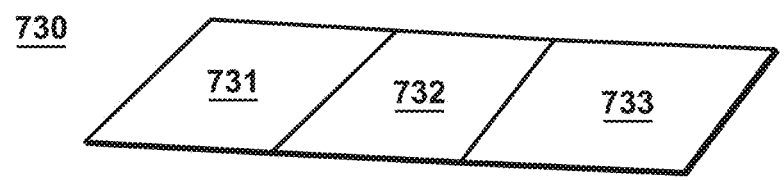

In yet another configuration, the flow chart 500 may be used to close discontinuities, as shown in FIGS. 7A, 7B and 7C. FIGS. 7A, 7B and 7C are exemplary diagrams associated with the closing of discontinuities for interpolation in accordance with an embodiment of the present techniques. A surface or mesh may have one or multiple discontinuities that may be suppressed in the interpolation. Surface 710 includes three pieces, such as pieces 711, 712, and 713. Pieces 711 and 712 are partially disconnected, while pieces 712 and 713 are totally separate. Yet, a map may be created that does not account for discontinuities. The discontinuities may need to be removed for the interpolation.

Rather than creating discontinuities by removing connection, discontinuities may be removed in block 502 of FIG. 5 by addition of connection between nodes and associating these newly created connections with short distances. First, nodes are correlated across a discontinuity. These correlations are used to create additional connections in the inputted surface 720 or its neighborhood graph as indicated by the connections 724 and 725. These additional connections can be many-to-many connections. One node on one patch (e.g., patch 721) may connect multiple nodes on another patch (e.g., patch 722). Preferably, a new connection is associated with a short distance. Preferred choices for such distances are zero, a finite but small value (e.g., 1.0×10e-3), or the average distance between neighboring nodes. Block 508 of FIG. 5 is performed to transform the surface to a contiguous state. Rather than increasing the number of dimensions, the dimensionality of the transformation space is maintained kept small, preferably of dimensionality two or three. The transformed surface 730 is shown in a transformation space of dimensionality two. Interpolation is performed in this space and the resulting values are mapped back onto the original nodes.

In some configurations of the present techniques, the closing of discontinuities is used to construct a design space as disclosed in U.S. Patent Application Nos. 2016124113 or 2016124117, which are each incorporated by reference herein. The development of a geologic model may be problematic. For example, populating two-dimensional or three-dimensional spaces or domains with material properties where the space includes multiple two-dimensional or three-dimensional separate objects is a problematic process in forming the subsurface models. The objects may partially contact each other, thus, forming a non-manifold topology. Further, the material properties in the space are typically assigned, which may be performed by a designer, modeler or user, to only one continuous object at a time. For flexibility in this approach, the original or physical domain, which may be referred to as a "physical space", may be mapped to a design domain, which may be referred to as a "design space". The design space includes the separate objects, which are pieced together based on some geometric criterion, and may form a continuous volume or an unfaulted volume. The mapping should be performed in manner to minimize deformation and to preserve in the design space the resemblance to the physical space (e.g., the original domain). This mapping is then used to facilitate the populating of the design space with the material properties. For example, in geologic modeling of a subsurface region, a three-dimensional (3D) model domain is delineated by horizons and faults, where horizons are primarily flat horizontal surfaces related to deposition of sediment material forming a reservoir rock, and faults are discontinuities in the rock introduced by non-depositional events. The material properties, such as the rock properties, are typically described in a continuous volume in the design space or depositional space, which may be provided by the user or modeler, while the physical space of the subsurface model may be a discontinuous volume that includes discontinuities in the form of post-depositional faults. Construction of design space corresponds to generation of a continuous volume from a faulted structural framework by removing the discontinuities, such as nodal slips. It may be advantageous to use the present techniques for discontinuity removal to build one or multiple design spaces.

In some embodiments of the present techniques, a first transform domain and the original domain are concatenated to second transform domain. In some embodiments, interpolations are performed in this concatenated second transform domain. In a preferred embodiments, distances may be measured in the first transform domain, but orientations may be measured in the original domain to take advantage of the both the distances resulting from the modified discontinuities and the orientation of nodes to perform anisotropic interpolation, for example to apply kriging with anisotropic variograms.

In preferred embodiments, the seed or control points that have values (i.e., measured data), are associated with nodes of the surface (or mesh). In preferred embodiments, the points where values need to be interpolated are associated with nodes of the surface (or mesh). In some embodiments, however, seed points or interpolation points are not part of the surface (or mesh).

In some embodiments of the present techniques, a seed point or control point that is associated with a value is not one of the nodal points of the mesh. In one embodiment, such a value is transferred onto a nearby nodal point, preferably onto the nearest nodal point of the mesh. In some embodiments, such a value is transferred onto multiple nearby nodal points of the mesh. In some embodiments, such a value is distributed onto multiple nearby nodal points of the mesh in a weighted manner, for example, distance weighted extrapolation.

In some embodiment of the present techniques, an interpolation value may be determined at a point that is not one of the nodal points of the mesh. In one embodiment, such a value is transferred from a nearby nodal point, preferably from the nearest nodal point of the mesh. In some embodiments, such a value is transferred from multiple nearby nodal points of the mesh. In some embodiments, such a value is interpolated from multiple nearby nodal points of the mesh in a weighted manner, for example, distance weighted interpolation.

In some embodiment of the present techniques, a value in the transform space at a point that is not one of the nodal points of the transformed mesh needs to be transferred into the original space. This problem is known as the pre-image problem in kernel methods. See Kwok et al., "The Pre-Image Problem in Kernel Methods", accessed at <<https://www.aaai.org/Papers/ICML/2003/ICML03-055.pdf>>. In some embodiments, the pre-image problem is solved using non-linear optimization. In a preferred embodiment, distance constraints in the transform space are used to find the location and value in the original space.

Persons skilled in the technical field will readily recognize that in practical applications of the disclosed methodology, it is partially performed on a computer, typically a suitably programmed digital computer. Further, some portions of the detailed descriptions which follow are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "processing" or "computing", "calculating", "comparing", "determining", "displaying", "copying," "producing," "storing," "adding," "applying," "executing," "maintaining," "updating," "creating," "constructing" "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.), and a machine (e.g., computer) readable transmission medium (electrical, optical, acoustical or other form of propagated signals (e.g., carrier waves, infrared signals, digital signals, etc.)).

Furthermore, as will be apparent to one of ordinary skill in the relevant art, the modules, features, attributes, methodologies, and other aspects of the invention can be implemented as software, hardware, firmware or any combination of the three. Of course, wherever a component of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of skill in the art of computer programming. Additionally, the present invention is in no way limited to implementation in any specific operating system or environment.

Figure 8:
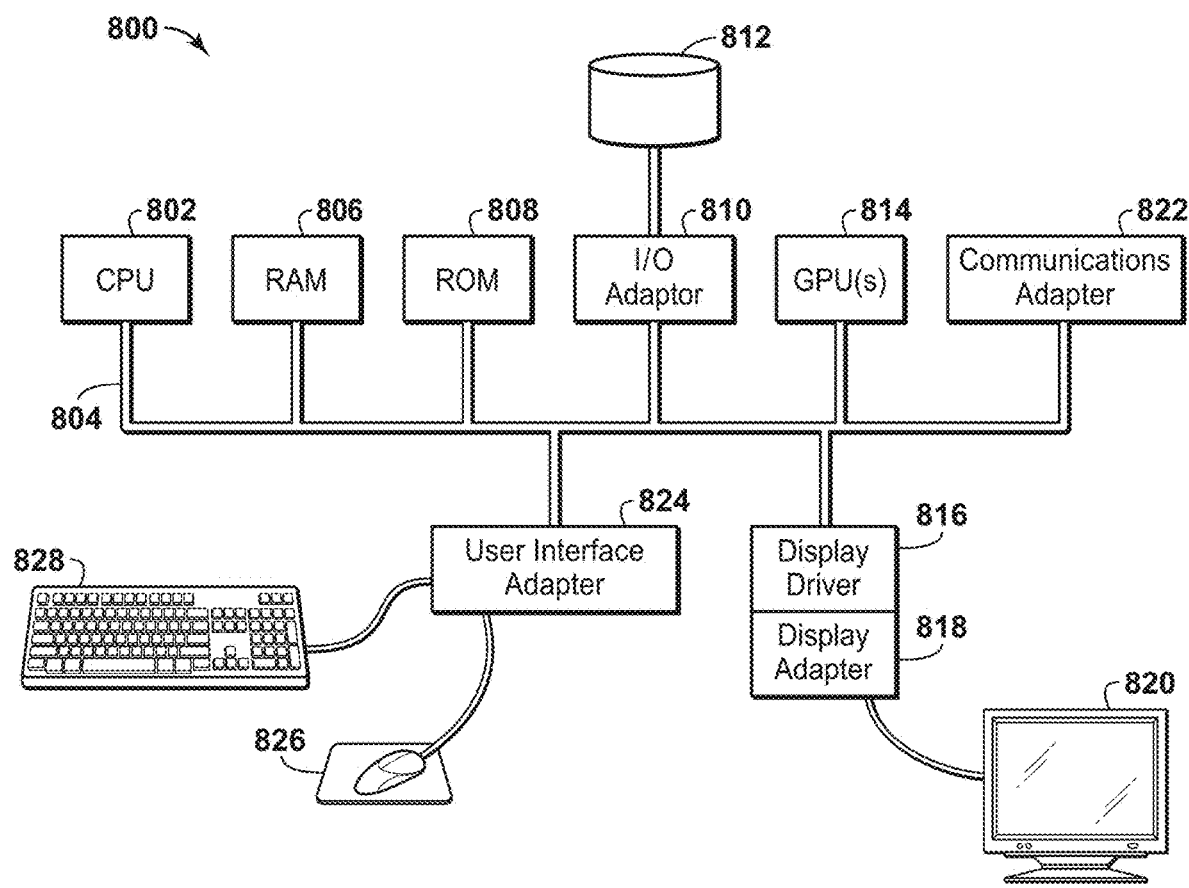
FIG. 8 is a block diagram of a computer system that may be used to perform any of the methods disclosed herein.

As an example, FIG. 8 is a block diagram of a computer system 800 that may be used to perform any of the methods disclosed herein. A central processing unit (CPU) 802 is coupled to system bus 804. The CPU 802 may be any general-purpose CPU, although other types of architectures of CPU 802 (or other components of exemplary system 800) may be used as long as CPU 802 (and other components of system 800) supports the present techniques as described herein. The CPU 802 may execute the various logical instructions according to disclosed aspects and methodologies. For example, the CPU 802 may execute machine-level instructions for performing processing according to aspects and methodologies disclosed herein.

The computer system 800 may also include computer components such as a random access memory (RAM) 806, which may be SRAM, DRAM, SDRAM, or the like. The computer system 800 may also include read-only memory (ROM) 808, which may be PROM, EPROM, EEPROM, or the like. RAM 806 and ROM 808 hold user and system data and programs, as is known in the art. The computer system 800 may also include an input/output (I/O) adapter 810, a graphical processing unit(s) (GPU(s)) 814, a communications adapter 822, a user interface adapter 824, and a display adapter 818. The I/O adapter 810, the user interface adapter 824, and/or communications adapter 822 may, in certain aspects and techniques, enable a user to interact with computer system 800 to input information.

The I/O adapter 810 preferably connects a storage device(s) 812, such as one or more of hard drive, compact disc (CD) drive, floppy disk drive, tape drive, and the like to computer system 800. The storage device(s) may be used when RAM 806 is insufficient for the memory requirements associated with storing data for operations of embodiments of the present techniques. The data storage of the computer system 800 may be used for storing information and/or other data used or generated as disclosed herein. The communications adapter 822 may couple the computer system 800 to a network (not shown), which may enable information to be input to and/or output from system 800 via the network (for example, a wide-area network, a local-area network, a wireless network, any combination of the foregoing). User interface adapter 824 couples user input devices, such as a keyboard 828, a pointing device 826, and the like, to computer system 800. The display adapter 818 is driven by the CPU 802 to control, through a display driver 816, the display on a display device 820.

The architecture of system 800 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

As may be appreciated, the method may be implemented in machine-readable logic, such that a set of instructions or code that, when executed, performs the instructions or operations from memory. By way of example, a system for generating a subsurface model having one or more objects associated with a subsurface region is described. The system comprises: a processor; an input device in communication with the processor and configured to receive input data associated with a subsurface region; and memory in communication with the processor. The memory having a set of instructions, wherein the set of instructions, when executed by the processor, are configured to: create a mesh for a subsurface region in an original domain; compute connectivity and compartmentalization of the mesh; transform mesh into a transform domain wherein the transform domain is configured to exaggerate distance across discontinuities; transform measured data into the transform domain; interpolate the measured data to a mesh in the transform domain; transform the interpolated measurements to the original domain; and output the interpolated mesh and/or measurements in the original domain.

In one or more embodiments, the system may include various enhancements. For example, the system may include wherein dimensionality of the created mesh plus the number of discontinuities may be an upper bound on the dimensionality of the transform domain; wherein the set of instructions may be further configured to: preserve local distances between surface nodes in the mesh, but exaggerates distances when nodes are separated by a discontinuity; wherein the set of instructions may be configured to: compute the distance based on a Manhattan distance that is computed by propagating the distance from a first surface node to a second surface node; wherein the set of instructions may be configured to: compute the distance based on a Euclidian distance that is computed between a first surface node to a second surface node; wherein the set of instructions may be configured to: build a reservoir model from the interpolated mesh and assign properties to the mesh elements of the interpolated mesh; wherein the properties comprise one or more of porosity, permeability and any combination thereof; simulating fluid flow within the reservoir model to create simulation results; wherein the set of instructions may be further configured to: manage hydrocarbon operations based on the simulation results.

It should be understood that the preceding is merely a detailed description of specific embodiments of the invention and that numerous changes, modifications, and alternatives to the disclosed embodiments can be made in accordance with the disclosure here without departing from the scope of the invention. The preceding description, therefore, is not meant to limit the scope of the invention. Rather, the scope of the invention is to be determined only by the appended claims and their equivalents. It is also contemplated that structures and features embodied in the present examples can be altered, rearranged, substituted, deleted, duplicated, combined, or added to each other. As such, it will be apparent, however, to one skilled in the art, that many modifications and variations to the embodiments described herein are possible. All such modifications and variations are intended to be within the scope of the present invention, as defined by the appended claims.

The invention claimed is:

1. A method for generating a subsurface model for a subsurface region comprising:
creating a mesh for a subsurface region in an original domain;
computing connectivity and compartmentalization of the mesh;
transforming the mesh into a transform domain wherein the transform domain is configured to exaggerate distance across discontinuities, wherein dimensionality of the created mesh plus the number of discontinuities is an upper bound on the dimensionality of the transform domain;
transforming measured data into the transform domain;
interpolating the measured data to the mesh in the transform domain;
transforming the interpolated measurements to the original domain; and
outputting the interpolated mesh and/or measurements in the original domain.

2. The method of claim 1, wherein the transforming mesh into the transform domain further comprises preserving local distances between surface nodes in the mesh and exaggerating distances when nodes are separated by a discontinuity.

3. The method of claim 2, wherein the distance is computed based on a Manhattan distance that is computed by propagating the distance from a first surface node to a second surface node.

4. The method of claim 2, wherein the distance is computed based on a Euclidian distance that is computed between a first surface node to a second surface node.

5. The method of claim 1, further comprising building a reservoir model from the interpolated mesh and assigning properties to the mesh elements of the interpolated mesh.

6. The method of claim 5, wherein the properties comprise one or more of porosity, permeability and any combination thereof.

7. The method of claim 5, further comprising simulating fluid flow within the reservoir model to create simulation results.

8. The method of claim 1, wherein the measured data are either at least one component of the mesh coordinates or a categorical, discrete, or continuous property attributed to mesh nodes.

9. The method of claim 7, further comprising managing hydrocarbon operations based on the simulation results.

10. A system for generating a subsurface model having one or more objects associated with a subsurface region, comprising:
a processor;
an input device in communication with the processor and configured to receive input data associated with a subsurface region;
memory in communication with the processor, the memory having a set of instructions, wherein the set of instructions, when executed, are configured to:
create a mesh for a subsurface region in an original domain;
compute connectivity and compartmentalize of the mesh;
transform mesh into a transform domain wherein the transform domain is configured to exaggerate distance across discontinuities, wherein dimensionality of the created mesh plus the number of discontinuities is an upper bound on the dimensionality of the transform domain;
transform measured data into the transform domain;
interpolate the measured data to a mesh in the transform domain;
transform the interpolated measurements to the original domain; and
output the interpolated mesh and/or measurements in the original domain.

11. The system of claim 10, wherein the set of instructions are further configured to:
preserve local distances between surface nodes in the mesh and to exaggerate distances when nodes are separated by a discontinuity.

12. The system of claim 11, wherein the set of instructions, when executed by the processor, are configured to: compute the distance based on a Manhattan distance that is computed by
propagating the distance from a first surface node to a second surface node.

13. The system of claim 11, wherein the set of instructions, when executed by the processor, are configured to: compute the distance based on a Euclidian distance that is computed between a first surface node to a second surface node.

14. The system of claim 10, wherein the set of instructions, when executed by the processor, are configured to: build a reservoir model from the interpolated mesh and assign properties to the mesh elements of the interpolated mesh.

15. The system of claim 14, wherein the properties comprise one or more of porosity, permeability and any combination thereof.

16. The system of claim 14, further comprising simulating fluid flow within the reservoir model to create simulation results.

17. The system of claim 16, wherein the set of instructions, when executed by the processor, are further configured to: manage hydrocarbon operations based on the simulation results.

* * * * *